United States Patent
Chang et al.

(10) Patent No.: US 9,418,582 B2
(45) Date of Patent: Aug. 16, 2016

(54) TEST CELL STRUCTURE OF DISPLAY PANEL AND RELATED DISPLAY PANEL

(71) Applicant: AU Optronics Corp., Hsin-Chu (TW)

(72) Inventors: Cheng-Liang Chang, Hsin-Chu (TW);
Yuh-Huah Wang, Hsin-Chu (TW);
Yen-Yu Peng, Hsin-Chu (TW);
Che-Ming Yang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 142 days.

(21) Appl. No.: 14/562,785

(22) Filed: Dec. 8, 2014

(65) Prior Publication Data
US 2016/0078792 A1 Mar. 17, 2016

(30) Foreign Application Priority Data
Sep. 16, 2014 (TW) .............................. 103131960 A

(51) Int. Cl.
*G09G 3/00* (2006.01)
*G01R 31/28* (2006.01)
*G09G 3/36* (2006.01)

(52) U.S. Cl.
CPC ................ *G09G 3/006* (2013.01); *G01R 31/28* (2013.01); *G09G 3/36* (2013.01); *G09G 2330/12* (2013.01)

(58) Field of Classification Search
CPC ........ G01R 31/28; G01R 13/00; G09G 3/006; G09G 2330/12; G09G 2330/04
See application file for complete search history.

(56) References Cited

U.S. PATENT DOCUMENTS

| | | | |
|---|---|---|---|
| 8,482,498 B2 | 7/2013 | Lin | |
| 8,912,813 B2 * | 12/2014 | Huang | G02F 1/1309 324/760.01 |
| 2006/0192585 A1 * | 8/2006 | Chen | G09G 3/006 324/760.01 |
| 2007/0018680 A1 * | 1/2007 | Jeon | G09G 3/006 324/750.3 |
| 2012/0056186 A1 * | 3/2012 | Shirouzu | G02F 1/136204 257/59 |
| 2013/0141314 A1 | 6/2013 | Ka | |
| 2014/0104251 A1 * | 4/2014 | Zhang | G09G 3/3611 345/205 |

FOREIGN PATENT DOCUMENTS

| | | |
|---|---|---|
| TW | I399734 | 6/2013 |
| TW | 201329472 | 7/2013 |

* cited by examiner

*Primary Examiner* — Jeff Natalini
(74) *Attorney, Agent, or Firm* — Winston Hsu; Scott Margo

(57) ABSTRACT

A test cell structure of a display panel is disposed in the peripheral region of the display panel. First conductive lines and second conductive lines extend from the display region to the peripheral region, and the amounts of the first and second conductive lines are the same. The test cell structure includes a plurality of first test transistors, a plurality of second test transistors, and a plurality of first shorting bars. The drains of the first test transistors are electrically connected to the first conductive lines respectively, and their sources are electrically connected to the first shorting bars. The sources of the second test transistors are electrically connected to the drains of the first test transistors respectively, and their drains are electrically connected to the second conductive lines. The first test transistors are disposed between the second test transistors and the display region.

11 Claims, 4 Drawing Sheets

TEST CELL STRUCTURE OF DISPLAY PANEL AND RELATED DISPLAY PANEL

BACKGROUND OF THE INVENTION

1. Field of the Invention

The present invention relates to a test cell structure and a display panel including the test cell structure, and more particularly, to a test cell structure and a display panel including the test cell structure that are capable of providing the defect test function of the conductive lines both in the peripheral region and in the display region simultaneously.

2. Description of the Prior Art

As the development of technology, various kinds of display panels have been applied to many electronic products in daily life. Generally, a display panel includes a plurality of pixel and a plurality of conductive lines for sending signals to the pixels in order to display images. As a result, in the fabrication of display panel, it is required to test the conductive lines for finding out if there is any defect existing, such as line broken. The conventional test method is to dispose shorting lines that are electrically connected to the conductive lines in the peripheral region of the display panel, and to cut out the shorting lines by laser after the defect test process such that the display panel can operate normally. However, the aforementioned conventional test method has the disadvantage that the additional cutting process of the shorting lines cannot be omitted and the shorting lines that cannot be reused after the cutting process still occupy a certain space of the display panel. In addition, since the line distances between the conductive lines are decreased near the chip, the space near the chip is not enough of other test devices with the same numbers of the conductive lines.

SUMMARY OF THE INVENTION

It is one of the objectives of the present invention to provide a test cell structure and a display panel including the test cell structure that the test cell structure includes first test transistors and second test transistors located in different areas of the display panel respectively in order to provide the function of testing the defects of the conductive lines in the peripheral region and in the display region simultaneously.

To achieve the above objective, the present invention provides a test cell structure of a display panel, which is disposed at least in the peripheral region of the display panel, wherein the peripheral region is at least disposed at one side of the display region of the display panel, a plurality of first conductive lines and a plurality of second conductive lines extend from the display region to the peripheral region, and the amount of the first conductive lines and the second conductive lines are the same. The test cell structure of the present invention includes a plurality of first test transistors disposed in a first test area, a plurality of second test transistors disposed in a second test area, and a plurality of first shorting bars. The first test transistors have drains electrically connected to the first conductive lines respectively. The first test transistors have sources electrically connected to the first shorting bars respectively. The second test transistors have sources electrically connected to the drains of the first test transistors respectively. The second test transistors have drains electrically connected to the second conductive lines respectively. In addition, the first test area is located between the second test area and the display region.

To achieve the above objective, the present invention further provides a display panel that has a display region and a peripheral region. The display panel includes a plurality of the aforementioned test cell structures and a pixel array and a chip. The test cell structures are disposed side by side in the peripheral region. The pixel array is disposed in the display region. The first conductive lines and the second conductive lines are electrically connected to the pixel array, and the chip is electrically connected to the first conductive lines and the second conductive lines.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
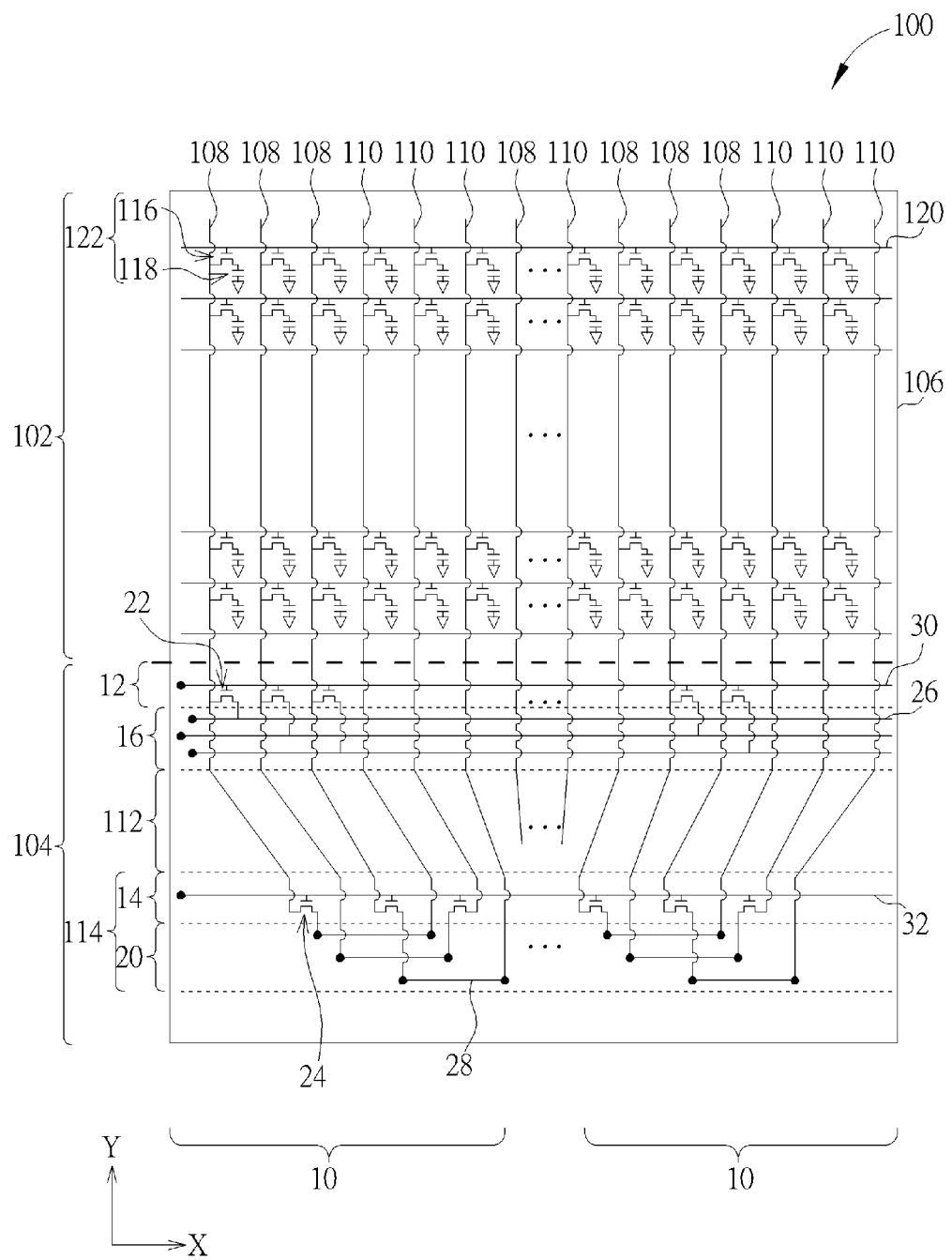
FIG. 1 is a schematic equivalent circuit diagram of the display panel including the test cell structure according to a first embodiment of the present invention.
Figure 2:
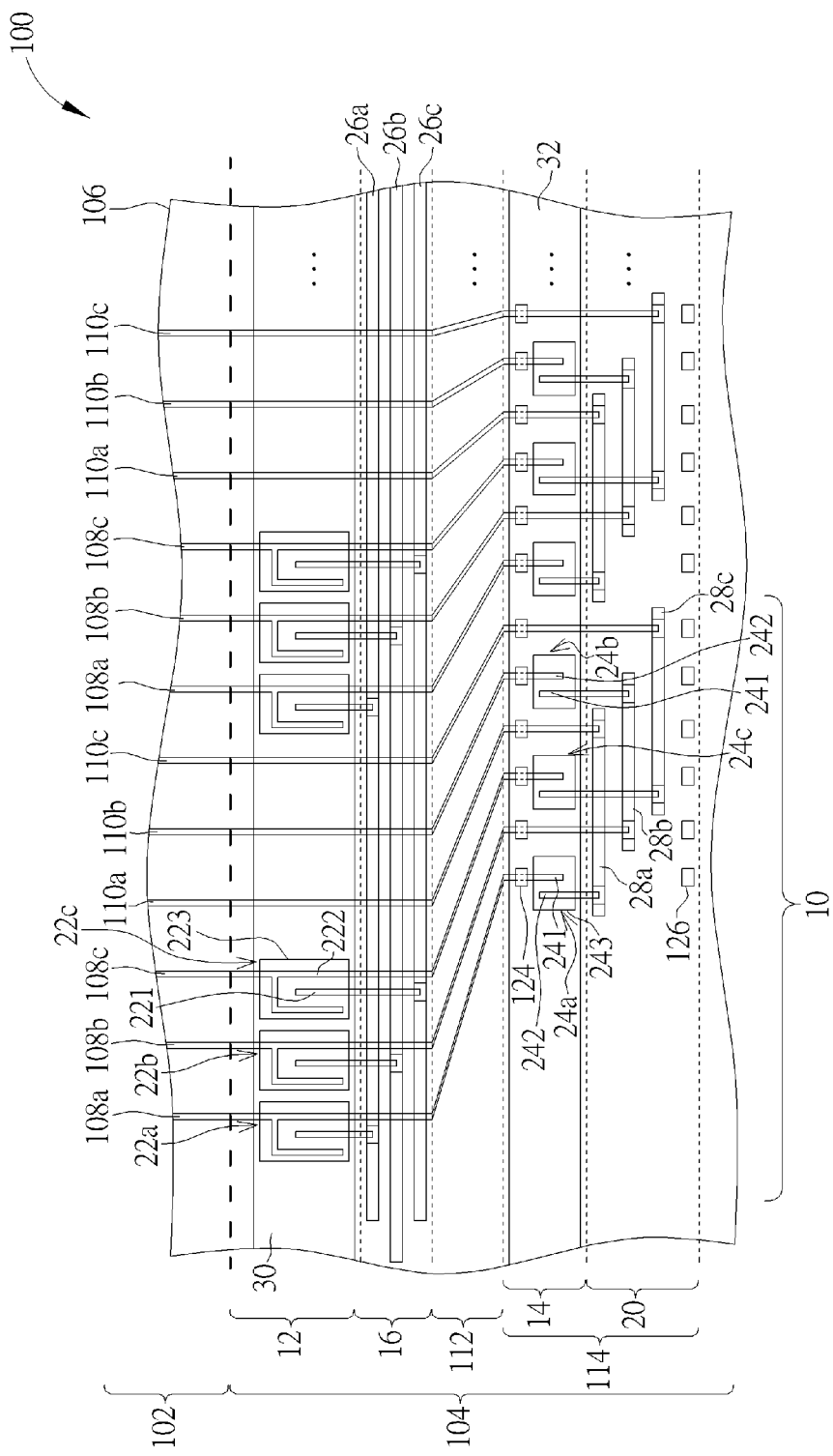
FIG. 2 is a schematic partial enlargement diagram of the test cell structure according to the first embodiment of the present invention.

Referring to FIG. 1 and FIG. 2, FIG. 1 is a schematic equivalent circuit diagram of the display panel including the test cell structures according to a first embodiment of the present invention, and FIG. 2 is a schematic partial enlargement diagram of the test cell structure according to the first embodiment of the present invention, wherein the detailed structure design and relative positions of the main elements of the present embodiment test cell structure are shown in FIG. 2. The present embodiment provides a display panel 100 and a test cell structure 10 thereof. The display panel 100 includes a substrate 106, wherein a display region 102 and a peripheral region 104 are defined thereon, and the peripheral region 104 is at least disposed at one side of the display region 102. As shown in FIG. 1, the peripheral region 104 of this embodiment is positioned below the display region 102, but not limited thereto. The display panel 100 further includes a plurality of first conductive lines 108 and a plurality of second conductive lines 110 disposed on the substrate 106, extending from the display region 102 to the peripheral region 104. For example, the first conductive lines 108 and the second conductive lines 110 extend along the direction in parallel with the first direction Y. In a preferable embodiment, the first conductive lines 108 and the second conductive lines 110 have the same numbers. The display panel 100 may further include a plurality of third conductive lines 120 that extend along a second direction X in the display region 102. In this embodiment, the first conductive lines 108 and the second conductive lines 110 are data lines and the third conductive lines 120 are scan lines, thus the third conductive lines 120 cross each of the first conductive lines 108 and the second conductive lines 110 to define out a plurality of pixel areas (or called as sub-pixel areas) and the pixels 122 are disposed in the pixel areas respectively, but not limited thereto. As a result, it may be considered as that the display panel 100 includes a pixel array that has a plurality of pixels 122, electrically connected to the first conductive lines 108 and the second conductive lines 110. As an example, the display panel 100 of this embodiment is a liquid crystal (LC) display panel, wherein each pixel 122 includes a thin film transistor 116 and an LC capacitor 118. The LC capacitor 118 may be composed of a common electrode, a pixel electrode and an insulating layer disposed therebetween (not shown in the figure). When the display panel 100 is under operation, a common voltage is applied to the common electrode. The pixel electrode is electrically connected to the drain of the corresponding thin film transistor 116. The pixels 122 are used for producing red light, blue light or green light respectively, but not limited thereto. The display panel 100 may be other types of display panels, and the elements included by the pixels 122 are not limited to the above descriptions. In addition, the display panel 100 further includes a line fan-out area 112 and a chip disposition area 114 disposed in the peripheral region 104, wherein the chip disposition area 114 is the area where the chip is predetermined to be disposed, and the line fan-out area 112 is located between the chip disposition area 114 and the display region 102. The first conductive lines 108 and the second conductive lines 110 extend from the display region 102 to the peripheral region 104, passing through the line fan-out area 112 and entering the chip disposition area 114. There are pluralities of connecting pads 124, 126 disposed in the chip disposition area 114. The connecting pads 124 near the display region 102 are output connecting pads, each of which is electrically connected to one of the first conductive lines 108 or one of the second conductive lines 110 for outputting signals of the chip to the corresponding first conductive line 108 or the second conductive line 110. The connecting pads 126 farther from the display region 102 are input connecting pads for delivering external control signals to the chip. Generally, within the display region 102, any two adjacent first conductive lines 108 and/or second conductive lines 110 are parallel to each other in the display region 102 by a constant line distance (or called line spacing), for example. However, the line distances of the portions of the first conductive lines 108 and the second conductive lines 110 positioned in the line fan-out area 112 are gradually reduced from the side of the line fan-out area 112 near the display region 102 to the side of the line fan-out area 112 near the chip disposition area 114, as shown in FIG. 2. In other words, in the fan-out area 112, the first conductive lines 108 and the second conductive lines 110 are arranged side by side and not parallel to each other. Furthermore, the portions of the first conductive lines 108 and the second conductive lines 110 disposed in the chip disposition area 114 are parallel to each other again, while the line distances between adjacent conductive lines are much smaller than those in the display region 102. For instance, the line distances of any adjacent two of the first conductive lines 108 and the second conductive lines 110 in the display region 102 are 20 to 40 micrometers, deemed as the pixel pitch, and the line distances between the first conductive lines 108 and/or the second conductive lines 110 in the chip disposition area 114 may be 10 to 15 micrometers, deemed as the pad pitch.

In another aspect, the test cell structure 10 of the present embodiment is disposed in the peripheral region 104 of the display panel 100 for testing if there are conductive line defects in the display panel 100. In this embodiment, the test to the first conductive lines 108 and the second conductive lines 110 will be described as an example. The display panel 100 of this embodiment includes a plurality of test cell structures 10 sequentially arranged side by side in the peripheral region 104. In order to provide a simple and clear figure, FIG. 1 only illustrates two test cell structures 10, while the relative positions and connections of each element of the test cell structure 10 may be referred to FIG. 2. Basically, the test cell structure 10 of the present embodiment includes the first test area 12 and the second test area 14, and may selectively further include the first shorting bar area 16 and the second shorting bar area 20. The first test area 12 is positioned between the second test area 14 and the display region 102. The first shorting bar area 16 is positioned between the first test area 12 and the second test area 14. The second shorting bar area 20 is positioned at the outer side of the second test area 14, which means the second test area 14 is positioned between the second shorting bar area 20 and the first test area 12. In this embodiment, the second test area 14 and the second shorting bar area 20 are disposed in the chip disposition area 114 of the display panel 100, but not limited thereto. In addition, the line fan-out area 112 is positioned between the first test area 12 and the second test area 14. Taking the most left test cell structure 10 as an example, one single test cell structure 10 includes a plurality of first test transistors 22, a plurality of first shorting bars 26 and a plurality of second test transistors 24 disposed in the first test area 12, the first shorting bar area 16 and the second test area 14 respectively, wherein the first test transistors 22 and the second test transistors 24 may be, for instance, thin film transistors, whose film-stacked structures may be similar to the thin film transistors 116 in the pixels 122. The first test transistors 22 are preferably positioned between the second test transistors 24 and the display region 102. Furthermore, the test cell structure 10 of this embodiment may further selectively include a first test gate line 30 and a second test gate line 32 disposed in the first test area 12 and the second test area 14 respectively, wherein portions of the first test gate line 30 and the second test gate line 32 respectively serve as the gates of the first test transistor 22 and the second test transistor 24 respectively. According to the present embodiment, each of the first test transistors 22 includes a source 221, a drain 222, a semiconductor channel layer 223 and a gate (a portion of the first test gate line 30), wherein the drain 222 of each first test transistor 22 is electrically connected to the corresponding first conductive line 108, and the source 221 of each first test transistor 22 is electrically connected to the corresponding first shorting bar 26. In addition, each of the second test transistors 24 includes a source 241, a drain 242, a semiconductor channel layer 243 and a gate (a portion of the second test gate line 32), wherein the source 241 of each second test transistor 24 is electrically connected to the drain 222 of the corresponding first test transistor 22, and each drain 242 is electrically connected to the second conductive line 110. In addition, the test cell structure 10 may selectively further include a plurality of second shorting bars 28. Each of the second shorting bars 28 electrically connects the drain 242 of the corresponding second test transistor 24 and the corresponding second conductive line 110, or electrically connects the drain 222 of the corresponding first test transistor 22 and the source 241 of the corresponding second test transistor 24. In other words, the drains 242 of some second test transistors 24 are electrically connected to their corresponding second conductive lines 110 through their corresponding second shorting bars 28, and the drains 222 of some first test transistors 22 are electrically connected to the sources 241 of their corresponding second test transistors 24 through their corresponding second shorting bars 28.

The relative electric connections of the elements of the test cell structure 10 will be further described in the following. In order to clearly explain, the first one to the third one of the first conductive lines 108 from the left side in FIG. 2 are represented by the numerals 108a, 108b, 108c respectively, and the first one to the third one of the second conductive lines 110 from the left side in FIG. 2 are represented by the numerals 110a, 110b, 110c respectively. In other words, the first conductive line 108a is the most left (the $1^{st}$ left) first conductive line 108 of the test cell structure 10; the first conductive line 108b is the second left (the $2^{nd}$ left) first conductive line of the test cell structure 10, etc. As an example, the $1^{st}$ left first conductive line 108a and the $1^{st}$ left second conductive line 110a are respectively corresponding to the pixels 122 for producing the first kind of three primary lights, such as red light; the $2^{nd}$ left first conductive line 108b and the $2^{nd}$ left second conductive line 110b are respectively corresponding to the pixels 122 for producing the second kind of three primary lights, such as green light; and the $3^{rd}$ left first conductive line 108c and the $3^{rd}$ left second conductive line 110c are respectively corresponding to the pixels 122 for producing the third kind of three primary lights, such as blue light. Therefore, both the $1^{st}$ left first conductive line 108a and the $1^{st}$ left second conductive line 110a with the first order (the $1^{st}$ left ones) are corresponding to the pixels 122 that produce the same color light, both the first conductive line 108b and the second conductive line 110b with the second order (the $2^{nd}$ left ones) are corresponding to the pixels 122 that produce the same color light, and both the first conductive line 108c and the second conductive line 110c with the third order (the $3^{rd}$ left ones) are corresponding to the pixels 122 that produce the same color light, but not limited thereto. In addition, the first shorting bars 26 corresponding and electrically connected to the first conductive lines 108a, 108b, 108c are respectively represented by the numerals 26a, 26b, 26c from top to bottom, the second shorting bars 28 corresponding and electrically connected to the first conductive lines 108a, 108b, 108c are respectively represented by the numerals 28a, 28b, 28c from top to bottom, the first test transistors 22 corresponding and electrically connected to the first conductive lines 108a, 108b, 108c are respectively represented by the numerals 22a, 22b, 22c from left to right. However, it should be noted that the second conductive lines 110a, 110b, 110c are respectively corresponding to and electrically connected to the $1^{st}$ left second test transistor 24a, the $2^{nd}$ left second test transistor 24b and the $3^{rd}$ left second test transistor 24c. Regarding the elements corresponding to the $1^{st}$ left first conductive line 108a, the drain 222 of the first test transistor 22a is electrically connected to the first conductive line 108a and to the source 241 of the second test transistor 24a at the same time, wherein the drain 222 of the first test transistor 22a is electrically connected to the source 241 of the second test transistor 24a by the first conductive line 108a that extends downward, passing through the line fan-out area 112 and entering the second test area 14, while the drain 242 of the second test transistor 24a is electrically connected to the second shorting bar 28a and further electrically connected to the $1^{st}$ left second conductive line 110a through the second shorting bar 28a. As a result, the second conductive line 110a is corresponding to the first conductive lines 108a. When performing the defect test, the first test transistor 22a and the second test transistor 24a can be turned on at the same time by providing switch voltages to the first test gate line 30 and the second test gate line 32 respectively and providing a test signal to the first shorting bar 26a. In such situation, the test signal is delivered through the drain 222 of the first test transistor 22a to the first conductive line 108a and the source 241 of the second test transistor 24a, passing through the drain 242 of the second test transistor 24a and the second shorting bar 28a and then to the corresponding second conductive line 110a. At this time, if the first conductive line 108a displays as a dark line, then the defect exists in the portion of the first conductive line 108a positioned from the first test transistor 22a to the display region 102. In another aspect, if the second conductive line 110a displays as a dark line when the first test transistor 22a and the second test transistor 24a are turned on, then the defect may exist in the portion of the second conductive line 110a positioned in the display region 102 or in the line fan-out area 112, or exist in the portion of the first conductive line 108a positioned in the line fan-out area 112. Regarding the $2^{nd}$ left first conductive line 108b and its corresponding elements, the drain 222 of the first test transistor 22b is electrically connected to the first conductive line 108b and electrically connected to the second shorting bar 28b by the first conductive line 108b that extends downward to sequentially pass through the line fan-out area 112 and the second test area 14 and enter the second shorting bar area 20. And the drain 222 of the first test transistor 22b is further electrically connected to the source 241 of the second test transistor 24b through the second shorting bar 28b. In another aspect, the drain 242 of the second test transistor 24b is electrically connected to its corresponding second conductive line 110b, the $2^{nd}$ left one. Therefore, the second conductive line 110b is corresponding to the first conductive line 108b. It should be noted that the subjects the source 241 and drain 242 of the second test transistor 24b electrically connected to are different from those of the second test transistor 24a. Accordingly, when performing the defect test, the first test transistor 22b and the second test transistor 24b can be turned on at the same time by respectively providing switch voltages to the first test gate line 30 and the second test gate line 32 and providing the test signal to the first shorting bar 26b such that the test signal can be delivered to the first conductive line 108b and the second shorting bar 28b from the drain 222 of the first test transistor 22b, and then to the source 241 of the second test transistor 24b through the second shorting bar 28b. As the second test transistor 24b is turned on, its drain 241 can receive the test signal and then further deliver it to the second conductive line 110b. At this time, if the first conductive line 108b displays as a dark line, then the defect exists in the portion of the first conductive line 108b positioned from the first test transistor 22a to the display region 102. On the other hand, if the second conductive line 110b displays as a dark line, then the defect may exist in the portion of the second conductive line 110b in the display region 102 or in the line fan-out area 112, or the defect may exist in the portion of the first conductive line 108b in the line fan-out area 112. In addition, the relative electrical connection of the $3^{rd}$ left first conductive line 108c and its corresponding elements of the test cell structure 10 in this embodiment is similar to that of the $1^{st}$ left first conductive line 108a, thus further detailed description will not be provided redundantly. As a result, since each of the first test transistors 22 and each of the second test transistors 24 are corresponding to one first conductive line 108 and one second conductive line 110 respectively, the first test transistors 22 and the second test transistors 24 have the same numbers as the first conductive lines 108 and the second conductive lines 110 that are predetermined to be tested in the same single test cell structure 10. Furthermore, the numbers of the first shorting bars 26 and the second shorting bars 28 are also the same as the numbers of the first test transistors 22 in the same single test cell structure 10. However, it should be noted that the display panel 10 may include a plurality of the test cell structure 10 of this embodiment at the same time and the first shorting bars 26 may be common for all the test cell structures 10, such that the total amount of the first shorting bars 26 are only three in the display panel 100 of this embodiment, which is equal to the amount of the first test transistors 22 in each test cell structure 10. In another aspect, all the test cell structures 10 has three second shorting bars 28 respectively, and therefore the total amount of the second shorting bars 28 in the display panel 100 is greater than the total amount of the first shorting bars 26.

From the above, by the way of disposing the first test transistors 22, the second test transistors 24 and the first shorting bars 26 and other collocation elements of the test cell structure 10, the defects of the first conductive lines 108 and the second conductive lines 110 existing in the display region 102 and in the peripheral region 104 (including the line fan-out area 112) can be directly found out by using the test cell structure 10 to perform the defect test. And no additional process of using a laser to cut any line or element of the test cell structure 10 is needed after the defect test, such that the fabrication cost can be saved. Even more, after the chip is bonded, the first test transistors 22, the second test transistors 24 and other elements of the test cell structure 10 can still be utilized in other following test process, such as signal testing. In addition, although the distances of the first conductive lines 108 and the second conductive lines 110 in the line fan-out area 112 gradually decrease from the side near the first test area 12 to the side near the second test area 14, resulted in that the line distances between the first conductive lines 108 and the second conductive lines 110 in the second test area 14 are quite smaller than those in the display region 102, there are still enough space for setting the second test transistors 24 because the second test transistors 24 are disposed for alternate first conductive lines 108 or second conductive lines 110 in the second test area 14, even though the pad pitch is very small, such as from 10 to 15 micrometers. Accordingly, the test cell structure 10 of the present invention, with the relative connections, specific disposition positions and the correspondence relationship between the first test transistors 22, the second test transistors 24, the first shorting bars 26 and the second shorting bars 28 and the first conductive lines 108 and the second conductive lines 110, can not only provide the test function for finding out the defects of the whole conductive lines, but also solve the problem of the disposition space of the second test transistors 24 and other elements on the display panel 100.

Figure 3:
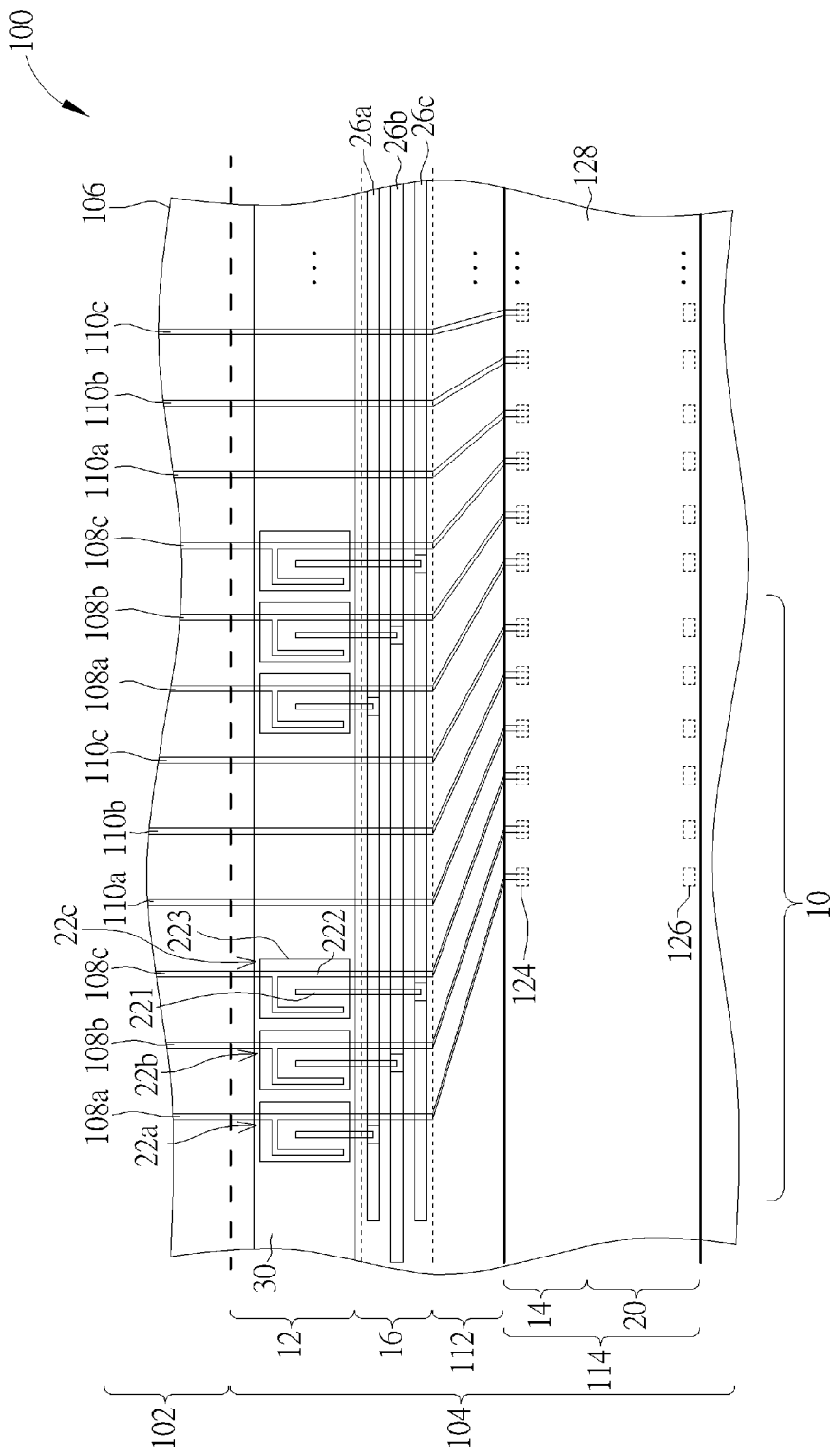
FIG. 3 is a schematic partial enlargement diagram of the display panel including a chip according to the first embodiment of the present invention.

Referring to FIG. 3, FIG. 3 is a schematic partial enlargement diagram of the display panel including a chip according to the first embodiment of the present invention, wherein the illustrated area of FIG. 3 is corresponding to FIG. 2. In FIG. 3, the display panel 100 of the present invention further includes a chip 128 that is disposed in the chip disposition area 114, covering at least one portion of the second test area 14 and at least one portion of the second shorting bar area 20. The logic circuit in the chip 128 is electrically connected to the corresponding connecting pads 124, 126 such that each of the connecting pads 124, 126 electrically connects the corresponding first conductive lines 108 or the second conductive lines 110 with the chip 128. It should be noted that only the connecting pads 124, 126 are illustrated with broken lines in the chip disposition area 114 in FIG. 3, in order to simplify and clarify the figure, while the other elements of the second test area 14 and the second shorting bar area 20 are omitted because the chip 128 covers the chip disposition area 114.

The display panel and test cell structure of the present invention are not limited by the aforementioned embodiment, and may have other different preferred embodiments and variant embodiments. To simplify the description, the identical components in each of the following embodiment are marked with identical symbols. For making it easier to compare the difference between the embodiments, the following description will detail the dissimilarities among different embodiments and the identical features will not be redundantly described.

Figure 4:
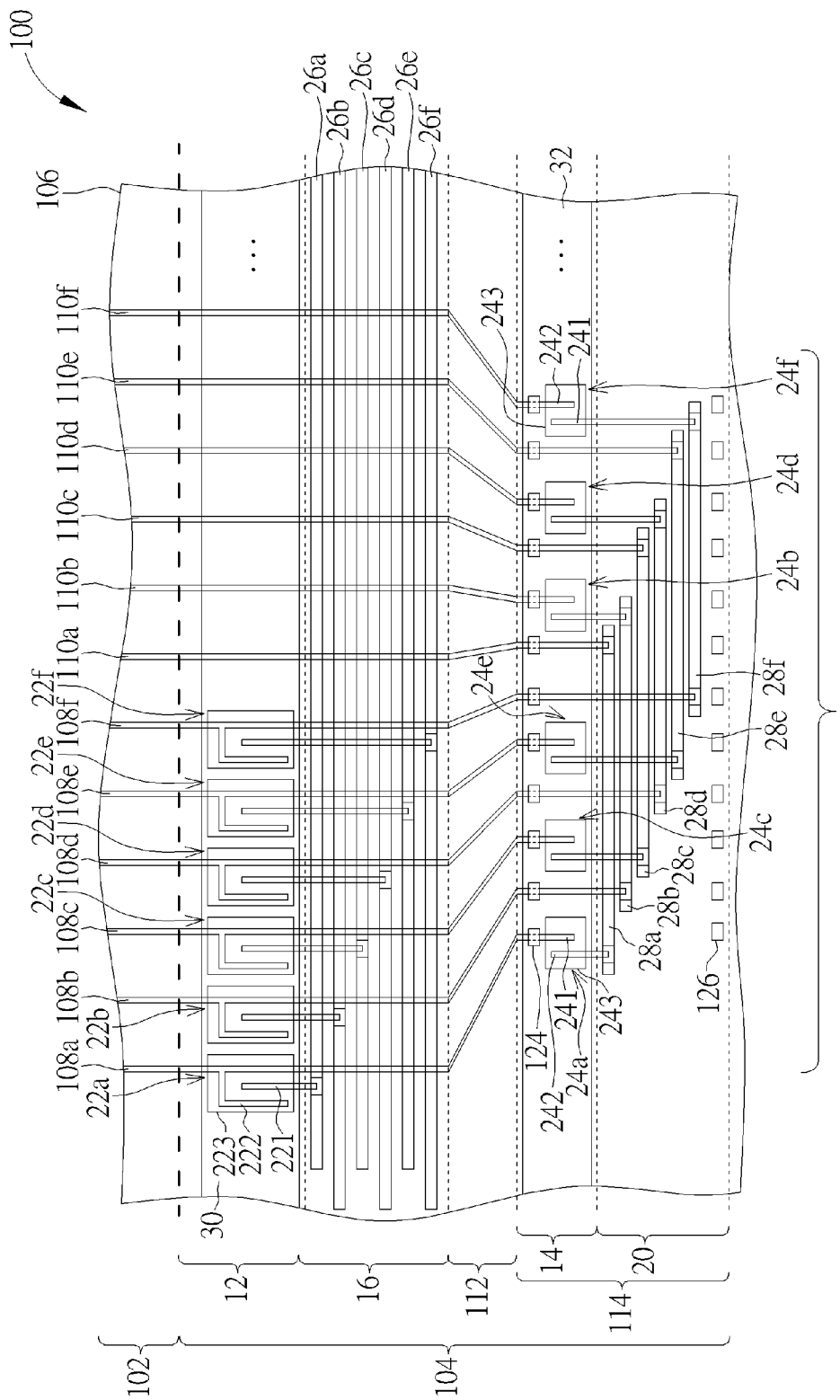
FIG. 4 is a schematic partial enlargement diagram of the test cell structure and the display panel according to a second embodiment of the present invention.

Referring to FIG. 4, FIG. 4 is a schematic partial enlargement diagram of the test cell structure and the display panel according to a second embodiment of the present invention. This embodiment is mostly different from the previous embodiment in that one single test cell structure 10 includes six first test transistors 22a, 22b, 22c, 22d, 22e, 22f, which are respectively corresponding to six first conductive lines 108a, 108b, 108c, 108d, 108e, 108f, to six first shorting bars 26a, 26b, 26c, 26d, 26e, 26f, to six second test transistors 24a, 24b, 24c, 24d, 24e, 24f, to six second shorting bars 28a, 28b, 28c, 28d, 28e, 28f and to six second conductive lines 110a, 110b, 110c, 110d, 110e, 110f. The correspondence relationships and relative connections of the first conductive lines 108a, 108c, 108e with other elements of the test cell structure 10 are similar to the first conductive lines 108a, 108c in the first embodiment, and those of the first conductive lines 108b, 108d, 108f with other elements of the test cell structure 10 are similar to the first conductive line 108b in the first embodiment as well. Similarly, the test method of each conductive line may be referred to the first embodiment and will not be redundantly described herein. In addition, the test cell structure 10 of this embodiment may also be applied to the present invention display panel 100, as illustrated in FIG. 1. For example, the display panel 100 may include a plurality of test cell structures 10 at the same time, arranged side by side in the peripheral region 104 of the display panel 100.

It should be noted that the amounts of the first conductive lines 108 and the second conductive lines 110 to be correspondingly tested by each test cell structure 10 can be adjusted based on the design requirement in this embodiment. Since general LC display panel adapts three kinds of pixels 122 (or sub-pixels) that produce red light, green light and blue light respectively for display images, the number of the first conductive lines 108 corresponding to one single test cell structure 10 is preferably greater than or equal to three, such as being a number of the multiple of 3, and the numbers of the second conductive lines 110, the first test transistor 22 and the second test transistor 24 are individually equal to the number of the first conductive lines 108, but not limited thereto. For example, if the pixels (or sub-pixels) are designed to include four kinds for producing red light, green light, blue light and white light respectively, then the number of the first conductive lines 108 is multiple of 4 and the numbers of the first conductive lines 108 corresponded by one single test cell structure 10 is greater than or equal to 4, such as a multiple of 4. Based on the spirit of the present invention, the numbers of the first conductive lines 108, the second conductive lines 110, the first test transistors 22 and the second test transistors 24 corresponding to or included by one single test cell structure 10 may be determined according to the number of the sub-pixels of each pixel. For example, when each pixel is composed of n numbers of sub-pixels, the numbers of the first conductive lines 108, the second conductive lines 110, the first test transistors 22 and the second test transistors 24 corresponding to or included by one single test cell structure 10 is n, n+1, n+2, n+3 . . . or a multiple of n.

As mentioned above, the test transistors of the present invention test cell structure are divided into two groups which are respectively the first test transistors disposed adjacent to the display region and the second test transistors disposed at the outer side of the line fan-out area. By electrically connecting the second test transistors to the corresponding first conductive lines and the second conductive lines, the portions of the first conductive lines and the second conductive lines positioned in both the display region and the peripheral region (including the line fan-out area) can be tested for finding out if there any defect exists. In addition, according to the disclosed relative connections of all the elements of the present invention test cell structure, both of the numbers of the second test transistors and the first test transistors are only a half of the total amount of the first conductive lines and the second conductive lines, so as to save the disposition space. Even though the pad pitch of the connecting pads is very small in the chip disposition area, sufficient amount of second test transistors can still be disposed therein. Accordingly, the disclosure of the present invention meets the requirements of fully testing the conductive lines and solving the problem of small disposition space of testing elements at the same time. In addition, after the defect test, it is not needed to additionally carry out a laser cut to the shorting lines or shorting bars on the display panel including the present invention test cell structure, thus the fabrication cost is further saved in contrast to the conventional structure, and the testing elements of the present invention cell structure remain on the display panel can be further utilized in other following test.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test cell structure of a display panel, disposed at least in a peripheral region of the display panel, wherein the peripheral region is at least disposed at one side of a display region of the display panel, the display panel includes a plurality of first conductive lines and a plurality of second conductive lines extending from the display region to the peripheral region, and the test cell structure comprising:
    a plurality of first test transistors, disposed in a first test area, wherein each of the first test transistors has a drain electrically connected to one of the first conductive lines;
    a plurality of first shorting bars, wherein each of the first test transistors has a source electrically connected to one of the first shorting bars; and
    a plurality of second test transistors, disposed in a second test area, the first test area being disposed between the second test area and the display region, wherein each of the second test transistors has a source electrically connected to the drain of one of the first test transistors, and each of the second test transistors has a drain electrically connected to one of the second conductive lines.

2. The test cell structure of the display panel of claim 1, wherein the first test transistors are disposed between the second test transistors and the display region, and amounts of the first conductive lines and the second conductive lines are the same.

3. The test cell structure of the display panel of claim 1, further comprising a plurality of second shorting bars, each of the second shorting bars electrically connecting between the drain of a corresponding second test transistor and a corresponding second conductive line, or electrically connecting between the drain of a corresponding first test transistor and the source of a corresponding second test transistor.

4. The test cell structure of a display panel of claim 3, wherein the second test transistors are disposed between the second shorting bars and the first shorting bars.

5. The test cell structure of the display panel of claim 1, further comprising a first test gate line electrically connected to gates of the first test transistors.

6. The test cell structure of a display panel of claim 5, further comprising a second test gate line electrically connected to gates of the second test transistors.

7. The test cell structure of the display panel of claim 1, wherein a portion of the first conductive lines and the second conductive lines disposed within a line fan-out area are arranged side by side and not parallel to each other, the line fan-out area is disposed between the first test area and the second test area, a line distance between one of the first conductive lines and one of the second conductive lines in the line fan-out area are gradually reduced from a side of the line fan-out area near the first test area to another side of the line fan-out area near the second test area.

8. The test cell structure of the display panel of claim 1, wherein the first test transistors, the second test transistors and the first conductive lines that connect to the same test cell structure have the same amounts.

9. The test cell structure of the display panel of claim 1, wherein the amount of the first conductive lines is equal to or greater than 3.

10. A display panel, having a display region and a peripheral region, the display panel comprising:
    a plurality of test cell structures as claimed in claim 1, disposed side by side in the peripheral region;
    a pixel array, disposed in the display region, wherein the first conductive lines and the second conductive lines are electrically connected to the pixel array; and
    a chip, electrically connected to the first conductive lines and the second conductive lines.

11. The display panel of claim 10, further comprising a plurality of connecting pads, each of the connecting pads electrically connecting a corresponding first conductive line with the chip or electrically connecting a corresponding second conductive line with the chip.

* * * * *